United States Patent [19]
Abe et al.

[11] Patent Number: 5,995,226
[45] Date of Patent: Nov. 30, 1999

[54] OPTICAL APPARATUS FOR MEASURING PROFILES OF A WAFER

[75] Inventors: Kohzo Abe, Annaka; Nobuaki Iguchi, Kawasaki, both of Japan

[73] Assignees: Super Silicon Crystal Research Institute Corporation, Japan; Kuroda Precision Industries Ltd., Japan

[21] Appl. No.: 09/093,219

[22] Filed: Jun. 8, 1998

[30] Foreign Application Priority Data

Jun. 11, 1997 [JP] Japan ................................ 9-154023

[51] Int. Cl.⁶ ....................................................... G01B 9/02
[52] U.S. Cl. ............................................ 356/359; 356/356
[58] Field of Search ................................... 356/359, 356, 356/358

[56] References Cited

U.S. PATENT DOCUMENTS

| | | | |
|---|---|---|---|
| 4,325,637 | 4/1982 | Moore | 356/359 |
| 4,854,708 | 8/1989 | Kafri et al. | 356/359 |

FOREIGN PATENT DOCUMENTS

| | | |
|---|---|---|
| 5-77179 | 1/1985 | Japan . |
| 1143906 | 6/1989 | Japan . |

*Primary Examiner*—Robert H. Kim
*Assistant Examiner*—Andrew H. Lee
*Attorney, Agent, or Firm*—Webb Ziesenheim Logsdon Orkin & Hanson, P.C.

[57] ABSTRACT

A pair of optical profile measuring systems 10, 20 are provided at positions faced to both sides of a wafer 1 vertically supported at its edge. Each system 10, 20 includes a light emitter 11, 21 for discharging a measuring light beam 12, 22, a collimator lens 14, 24 for rectifying the light beam 12, 22 into a collimated beam, an optical flat 15, 25 for transmitting the collimated light beam 12, 22, a light detector 16, 26 receiving the light beams 12, 22 reflected on a surface of the wafer 1 and on a referential plane of the optical flat 15, 25 through the collimator lens 14, 24 and a computer 17, 27 for processing interference fringes which occur between the surface of the wafer 1 and the referential plane of the optical flat 15, 25. Profiles of main and back surfaces of the wafer as well as its thickness variation are easily measured utilizing light interference fringes corresponding to both sides of a wafer.

2 Claims, 2 Drawing Sheets

OPTICAL APPARATUS FOR MEASURING PROFILES OF A WAFER

BACKGROUND OF THE INVENTION

The present invention relates to an optical apparatus which enables high-speed measurement of profiles of both sides as well as a thickness variation of a wafer.

A thickness variation of a wafer has been measured so far by either an optical method using interference fringes or a physical method using displacement sensors for scanning both sides of the wafer. The term thickness variation in this specification means a thickness distribution calculated as a distribution in height of one surface from the other surface of the wafer which is regarded as an ideal flat plane.

In the conventional optical method, thickness variation is calculated from interference fringes which occur between a referential plane of an optical lens and a surface of a wafer. The method enables high-speed measurement, but uses a vacuum chuck for holding the wafer. When the wafer is fixed to the vacuum chuck, its backside attracted to the vacuum chuck is likely deformed. Deformation of the wafer at the backside may be incorporated as an error in measurement results, so that the thickness variation of the wafer can not be obtained with high accuracy. There is also a defect that chucking flaws are likely formed on the backside, since the wafer is held in direct contact with the vacuum chuck.

Use of interference fringes derived from light beams reflected on both sides of a wafer is for detecting a thickness variation of a wafer is disclosed in Japanese Patent Application Laid-Open 1-143906. In this method, light beams discharged from a light source are split to transmitting and reflecting beams by a beam splitter, reflected on both sides of a wafer and then inputted to light detectors. Optical interference fringes occur in correspondence with a difference in an optical path between the transmitting and reflecting beams.

On the other hand, in the physical method using displacement sensors, a deviation in thickness of a wafer is calculated on the basis of signals detected by capacitance type displacement sensors provided at both sides of the wafer, to detect a thickness variation of the wafer regarding a back side as an ideal flat plane. For instance, Japanese Patent Publication No. 5-77179 discloses provision of displacement sensors faced to both sides of a wafer for production of deviation signals from every part of the wafer being rotated.

The physical method using displacement sensors has been commonly used so far for detecting a thickness variation of a wafer, since measurement is performed with high reproductivity without any defects caused by a vacuum chuck. However, the wafer necessarily rotated for scanning due to a small probe of the displacement sensor, so that it takes a therefor long time to scan the whole surface of the wafer.

When a part of the wafer attracted to a vacuum chuck is scanned, the wafer is re-held, and then movement of the sensors is changed to a swinging mode for scanning the part which was attracted with the vacuum chuck, as disclosed in Japanese Patent Publication No. 5-77179. The re-holding prolongs a measuring time in total and needs troublesome works.

During measuring, the wafer is rotated. Due to rotation, both sides of the wafer come in contact with a large quantity of the air, so that the wafer is exposed to adhesion of particles suspended in the air. Particles are also transferred from the vacuum chuck to the backside of the wafer. Adhesion of particles often unfavorably affects therefor the measurement results.

When a wafer is scanned with displacement sensors, an outer part of the wafer is not subjected to scanning in order to avoid incorporation of edge effects into detected signals. That is, the outer part of the wafer is treated as an unmeasurable zone, resulting in reduction of a surface part which can be measured.

A wafer for measurement is held by attracting its backside center to a vacuum chuck. Due to this holding means, measurement results are likely affected by gravity as enlargement of the wafer in size. Deformation of the wafer at its periphery is often incorporated as an error into measurement results.

Defects caused by holding a wafer with a vacuum chuck is eliminated by an optical method of measuring a thickness variation of a wafer in such a state kept free from a holding force, as disclosed in Japanese Patent Application Laid-Open 1-143906. According to this method, measurement is performed with ease in a short time, since the thickness variation is calculated from interference fringes. However, the interference fringes which occur between transmitted and reflected light beams reflected on both sides of the wafer are used for calculation of the thickness variation. Consequently, the thickness variation is merely judged from the interference fringes, but undulation or inclination of the wafer which is not accompanied with a thickness deviation can not be detected. In addition, affections of particles floating in the air, positioning of a wafer, dimensional accuracy of various parts to a measuring apparatus, etc. are likely incorporated as errors into measurement results due to a long light path necessarily designed for occurrence of interference fringes.

SUMMARY OF THE INVENTION

The present invention aims at high-speed precise measurement of a wafer.

The object of the present invention is to enable high-speed and precise measurement of profiles of both sides of a wafer without formation of flaws or adhesion of particles by use of two interference fringes corresponding.

The optical profile measuring apparatus according to the present invention provides a couple of optical measuring systems at positions faced to both sides of a wafer vertically supported at its edge.

Each system comprises a light emitter for discharging a measuring light beam, a collimator lens for rectifying the measuring light beam into a collimated beam, an optical flat for transmitting the collimated measuring beam, a light detector for receiving the measuring beams which are reflected on a surface of said wafer and a referential plane of said optical flat, and returned through the collimator lens, and a computer for processing interference fringes which occur between the two light beams reflected on the referential plane of the optical flat and the surface of the wafer. Profiles of both sides as well as a thickness variation of the wafer are calculated from the interference fringes corresponding to both sides of the wafer.

Triangular prisms may be used instead of optical flats. In this case, interference fringes corresponding to both sides of a wafer occur between referential planes of the triangular prisms and both sides of the wafer. A computer may be used for processing interference fringes corresponding to both sides of the wafer, instead of two computers respectively provided at the systems therefore. The number of image analyzing computers is preferably determined in response to the volume of image data as well as a processing speed.

DESCRIPTION OF THE PREFERRED EMBODIMENTS

Figure 1:
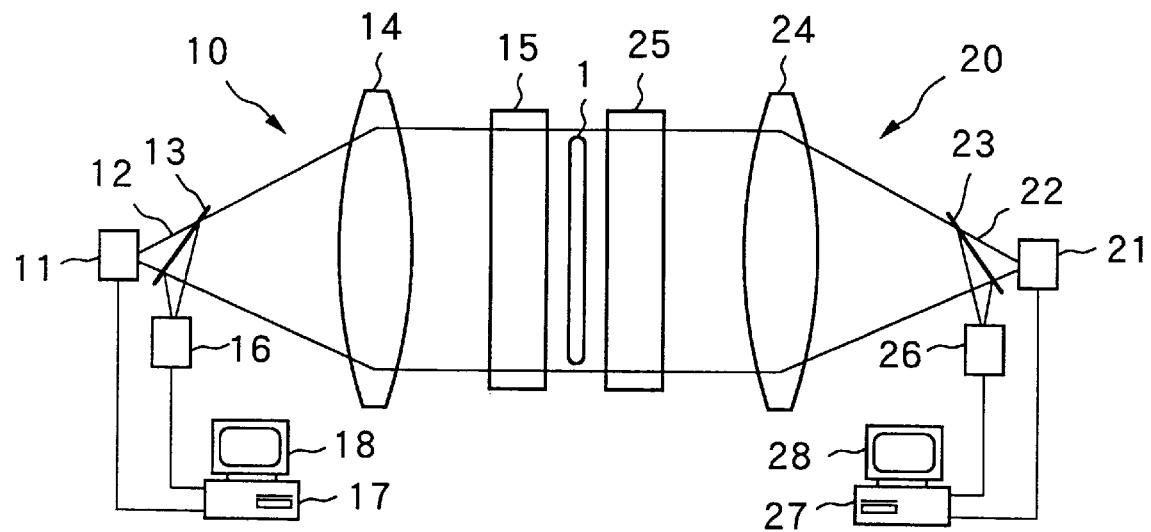
FIG. 1 is a schematic view illustrating a profile measuring apparatus using optical flats according to the present invention.

In the newly proposed optical profile measuring apparatus, a wafer 1 for measuring profiles and a thickness variation is vertically supported at its edge by appropriate means, as shown in FIG. 1. Due to the vertical supporting, the wafer 1 to be measured is kept in a free state released from restrictions by holding means such as a vacuum chuck. The vertical holding is also effective for measuring substantially the whole surface of the wafer 1, since there is no unmeasurable surface part caused by holding means.

Optical measuring systems 10, 20 are provided at both sides of the wafer 1. A light emitter 11, 21 in each optical measuring system 10, 20 discharges a measuring light beam 12, 22. Each light beam 12, 22 from the light emitter 11, 21 is transmitted through a half mirror 13, 23 to a collimator lens 14, 24 and then as a collimated beam through an optical flat 15, 25 to project both sides of the wafer 1. The light beam 12, 22 is reflected on the surface of the wafer, and also partially reflected on a referential plane of the optical flat 15, 25.

The measuring light beam 12, 22 reflected on the surface of the wafer 1 together with the light beam 12, 22 reflected on the referential plane of the optical flat 15, 25 returns through the optical flat 15, 25 and the collimator lens 14, 24 along the reverse path, reflected on the half mirror 13, 23 and then inputted to each light detector 16, 26.

The light path of the light beam 12, 22 reflected on both sides of the wafer is different in distance from the light path of the light beam 12, 22 reflected on the referential planes of the optical flats 15, 25. Since the difference between the light paths corresponds to profiles of the wafer 1 at both sides, interference fringes occur between two light beams reflected on surfaces of the wafer 1 and reflected on the referential planes of the optical flats 15, 25. Consequently, profiles of main and back surfaces of the wafer 1 are calculated from the interference fringes.

The light emitters 11, 21 and the light detectors 16, 26 are connected to computers 17, 27 equipped with monitors 18, 28. Both the interference fringes which have occurred between the referential planes of the optical lenses 15, 25 and both sides of the wafer 1 are simultaneously inputted to the computers 17, 27. Profiles of the main and back surfaces of the wafer 1 are calculated from input data of the interference fringes and recorded in the computers 17, 27. A thickness variation of the wafer 1 is also calculated from the profile of the main surface regarding the back surface as an ideal flat plane and recorded in the computers 17, 27.

Figure 2:
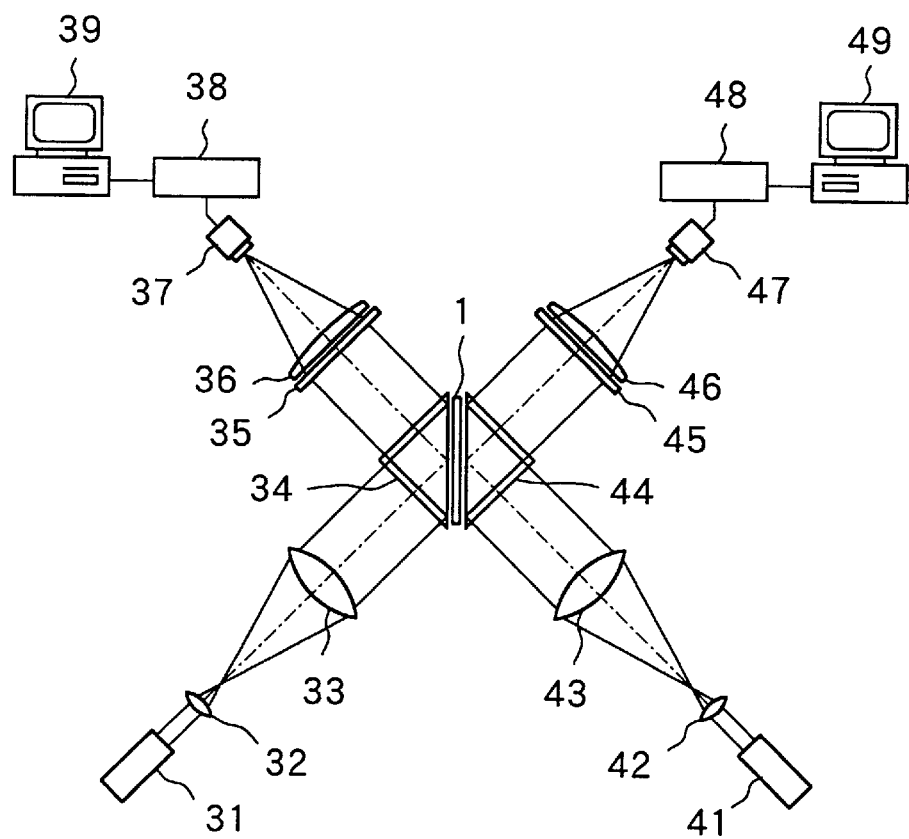
FIG. 2 is a schematic view illustrating a profile measuring apparatus using triangular prisms according to the present invention.

An oblique incidence method using triangular prisms instead of optical flats 15, 25 may be adopted, when a wafer to be measured has relatively rough surfaces. In this case, optical measuring systems as shown in FIG. 2 are provided at positions faced to both sides of a wafer 1. Each triangular prism 34, 44 has a referential plane opposed to both sides of the wafer 1. Each light beam discharged from a light emitter 31, 41 is expanded to a predetermined diameter by a convex lens 32, 42 or the like, collimated by a collimator lens 33, 43 and transmitted through the triangular prism 34, 44.

The light beams are partially transmitted through the triangular prisms 34, 44 and reflected on both sides of the wafer 1, while the remainders are reflected on reference planes of the triangular prisms 34, 44. The paths of the light beams reflected on both sides of the wafer 1 are different in distance from the paths of the light beams reflected on the referential planes of the triangular prisms 34, 44. The differential distances correspond to profiles of both sides of the wafer 1. Consequently, the same interference fringes as in the case shown in FIG. 1 occur in response to the differential distances.

The interference fringes are projected on screens 35, 45 to produce images on display panels of TV cameras 37, 47 through lenses 36, 46. The images are inputted as video signals to computers 38, 48. The computers 38, 48 analyze the video signals to calculate profiles of the wafer 1. The calculation results are recorded in the computers 38, 48 and displayed on monitors 39, 49 as occasion demands.

When a thickness variation of a wafer 1 is calculated from two interference fringes corresponding to both sides of the wafer 1 in this way, measurement results are obtained in a very short time period compared with a conventional method using displacement sensors. Furthermore, undulation and inclination of the wafer 1 are also detected from profiles of main and backside surfaces of the wafer 1.

Measurement is completed in a short time period according to the newly proposed method even in the case of a large-size wafer. For instance, a time of 30 seconds or shorter is enough to inspect one wafer of 400 mm in diameter including loading, alignment and unloading. Throughput is estimated more than 100 wafers/hour by combination of one measuring apparatus with a plurality of image-analyzing computers.

Since a wafer is vertically supported at its edge during measuring, deformation of the wafer caused by gravity is not incorporated into measurement results, and both sides of the wafer are prevented from formation of flaws. An edge of the wafer is apparently distinguished by observation of interference fringes, so that substantially the whole surface of the wafer can be subjected to measurement without any unmeasurable part near the edge of the wafer 1 as in a conventional method using displacement sensors. Furthermore, adhesion of particles from the air to the wafer is diminished, since the wafer is held in static state during measuring.

EXAMPLE

A polished single crystal silicon wafer of 725 μm in average thickness and of 200 mm in diameter was subjected to profile measurement using the apparatus shown in FIG. 1.

Figure 3:
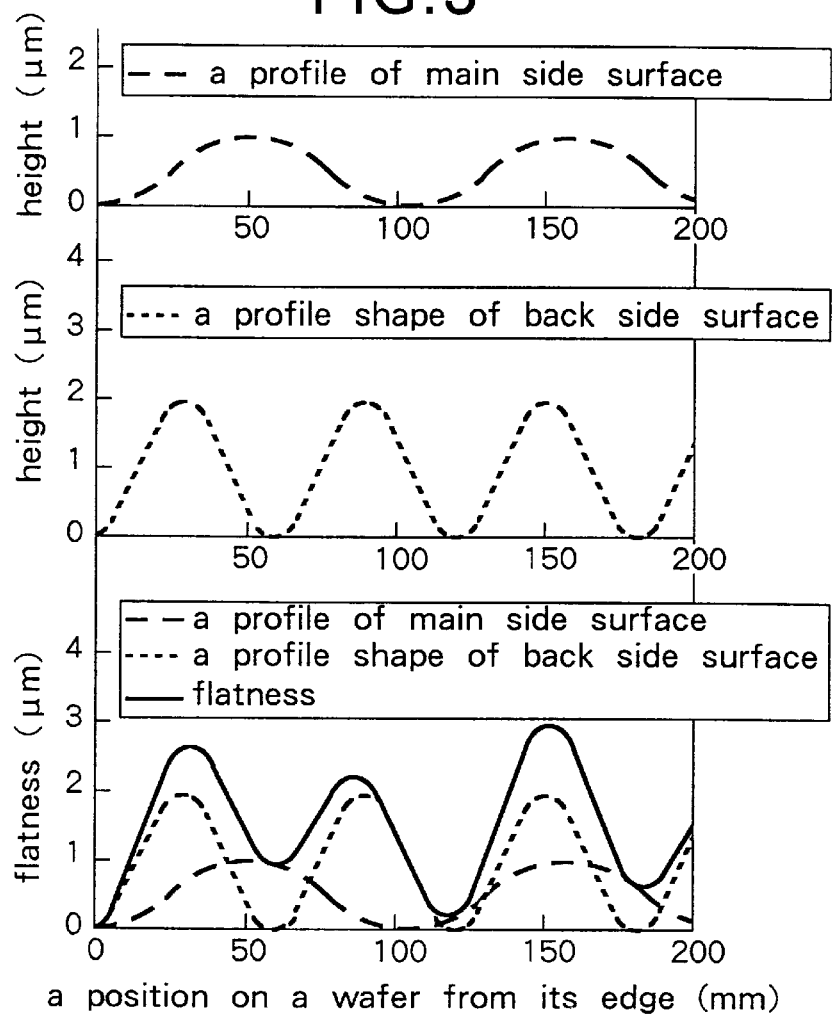
FIG. 3 is a graph showing profiles of main and back surfaces as well as a thickness variation of a wafer calculated from interference fringes.

A cross section of the wafer 1 was calculated from interference fringes corresponding to both sides of the wafer 1. Calculation results indicated deviations in height of main and backside surfaces of the wafer 1, as shown in upper and middle columns of FIG. 3, respectively. A height $H_1$ of the main surface was converted to a thickness variation F ($=H_2+H_1$) regarding a height $H_2$ of the back surface as a referential plane. The obtained thickness variation F is shown in the lower column of FIG. 3.

Figure 4:
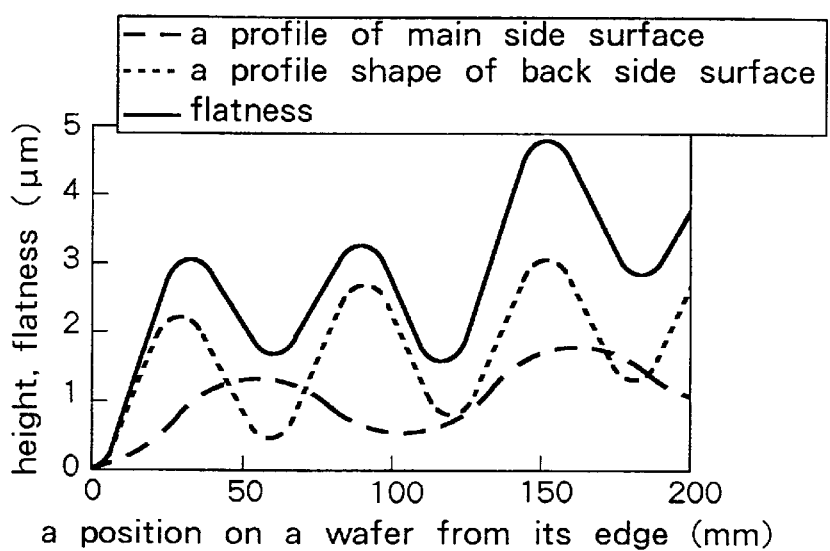
FIG. 4 is a graph showing profiles of main and back surfaces as well as a thickness variation of another wafer.

Another wafer having slight inclination was inspected in the same way. Results are shown as profiles of main and back surfaces in FIG. 4. When both the profiles were synthesized to calculate thickness variation, it was found that the wafer had flatness inclined along one direction.

It took only 15 seconds to complete operations for measuring one wafer including loading, alignment and unloading. thickness variation data obtained in this way was extremely precise with high reliability, as compared with a conventional method using displacement sensors. On the contrary, the conventional method necessitated approximately 1.5 min. for measuring a thickness variation of a wafer having the same size, and was unable to detect profiles of main and backside surface of the wafer.

EFFECT OF THE INVENTION

According to the present invention as aforementioned, interference fringes corresponding to both sides of a wafer are used for detecting profiles of main and back surfaces of the wafer as well as its thickness variation. The newly proposed method not only assures quick measurement of a thickness variation of a wafer in a very short time period compared with a conventional method using displacement sensors, but also enables detection of profiles of main and back surface of the wafer. Measurement results are obtained with high accuracy, since the wafer is vertically supported in a static state free from affection of gravity. The vertical supporting is also effective for protection of the wafer from formation of flaws or adhesion of particles.

What is claimed is:

1. An optical apparatus for measuring profiles of main and back surfaces of a wafer, the apparatus including a pair of optical measuring systems located at positions facing opposed main and back sides of a wafer vertically supported on edge, each of said optical measuring systems comprising:

a light emitter for discharging a measuring light beam;

a collimator lens for rectifying the measuring light beam into a collimated beam;

an optical flat for transmitting the collimated measuring beam;

a light detector for receiving two measuring beams, one of which is reflected on a surface of the wafer and returned through said optical flat and said collimator lens, the other of which is reflected on a referential plane of said optical flat and returned through said collimator lens; and a computer for processing interference fringes which occur between the two light beams, whereby profiles of the main and back surfaces are calculated from the interference fringes for each system and a thickness variation of the wafer is calculated from the interference fringes corresponding to both sides of the wafer.

2. An optical apparatus for measuring profiles of main and back surfaces of a wafer, the apparatus including a pair of optical measuring systems located at positions facing opposed main and back sides of a wafer vertically supported on edge, each of said optical measuring systems comprising:

a light emitter for discharging a measuring light beam;

a collimator lens for rectifying the measuring light beam into a collimated beam;

a triangular prism for transmitting the collimated measuring beam;

a light detector for receiving two measuring beams, one of which is reflected on a surface of the wafer and returned through said optical flat and said collimator lens, the other of which is reflected on a referential plane of said triangular prism and returned through said collimator lens; and a computer for processing interference fringes which occur between the two light beams, whereby profiles of the main and back surfaces are calculated from the interference fringes for each system and a thickness variation of the wafer is calculated from the interference fringes corresponding to both sides of the wafer.

\* \* \* \* \*

UNITED STATES PATENT AND TRADEMARK OFFICE
CERTIFICATE OF CORRECTION

PATENT NO. : 5,995,226
DATED : November 30, 1999
INVENTOR(S) : Kohzo Abe et al.

It is certified that error appears in the above-identified patent and that said Letters Patent is hereby corrected as shown below:

Column 1 Line 52 "wafer necessarily" should read --wafer is necessarily--.

Column 1 Line 54 before "long time" delete --therefor--.

Column 2 Line 1 before "long time" delete --therefor--.

Column 2 Line 65 after "systems" delete --therefore--.

Column 5 Line 3 "had flatness" should read --had thickness variation--.

Signed and Sealed this

Twenty-fourth Day of April, 2001

Attest:

NICHOLAS P. GODICI

Attesting Officer

Acting Director of the United States Patent and Trademark Office